(12) United States Patent
Risbo

(10) Patent No.: US 6,518,838 B1
(45) Date of Patent: Feb. 11, 2003

(54) CIRCUIT FOR COMPENSATING NOISE AND ERRORS FROM AN OUTPUT STATE OF A DIGITAL AMPLIFIER

(75) Inventor: Lars Risbo, Copenhagen (DK)

(73) Assignee: Texas Instruments Denmark A/S, Aalborg (*) Notice: Subject to any disclaimer, the term of this patent is extended or adjusted under 35 U.S.C. 154(b) by 0 days.

(21) Appl. No.: 09/890,757
(22) PCT Filed: Feb. 7, 2000
(86) PCT No.: PCT/DK00/00048
§ 371 (c)(1),
(2), (4) Date: Jan. 9, 2002
(87) PCT Pub. No.: WO00/46919
PCT Pub. Date: Aug. 10, 2000

(30) Foreign Application Priority Data

Feb. 5, 1999 (DK) .......................................... 1999 00159

(51) Int. Cl.[7] .......................... H03F 3/38; H03F 21/00; H03F 3/217
(52) U.S. Cl. ...................... 330/10; 330/207 A; 330/251
(58) Field of Search .............................. 330/10, 207 A, 330/251

(56) References Cited

U.S. PATENT DOCUMENTS

| | | | |
|---|---|---|---|
| 4,495,470 A | 1/1985 | Bristol | |
| 4,810,973 A | 3/1989 | Kurz | |
| 5,339,054 A | 8/1994 | Taguchi | |
| 5,396,190 A | 3/1995 | Murata | |
| 5,559,467 A | 9/1996 | Smedley | |
| 6,054,896 A | * 4/2000 | Wright et al. | ................ 330/149 |
| 6,373,334 B1 | * 4/2002 | Melanson | ..................... 330/10 |
| 6,414,614 B1 | * 7/2002 | Melanson | ..................... 330/10 |

FOREIGN PATENT DOCUMENTS

| | | |
|---|---|---|
| JP | 61-39708 | 2/1986 |
| WO | WO 99/45641 | 9/1999 |

* cited by examiner

Primary Examiner—Patricia Nguyen
(74) Attorney, Agent, or Firm—William B. Kempler; W. James Brady; Frederick J. Telecky, Jr.

(57) ABSTRACT

In a digital amplifier of the PCM-UPWM type there is no negative feedback stage, which means that noise caused by the switching output stage of such an amplifier directly affects the audio signal. A regulation loop is inserted between the output and the input of the digital amplifier, the regulation loop being adapted to form a compensation signal c(k) which is multiplied by the audio signal to compensate noise and errors from the switching output stage. In an embodiment, the regulation loop consists of a multiplying D/A converter (2) which is adapted to multiply the compensation signal c(k) by a multiplicative error signal m(t), and a summation unit (3), by summation of the output of the multiplying D/A converter (2) and a reference voltage (6), forms a second error signal e(t) which is fed to a low-pass filter (4) that is fed to the input of an ADC circuit (5) to form the multiplicative error signal c(k), which, optionally via a second adaptation filter (21), is fed to a multiplier (11) and the multiplying D/A converter (2). Expediently, the circuit of the invention is formed in full or in part by an integrated circuit.

20 Claims, 9 Drawing Sheets

AMENDED SHEET

CIRCUIT FOR COMPENSATING NOISE AND ERRORS FROM AN OUTPUT STATE OF A DIGITAL AMPLIFIER

FIELD OF THE INVENTION

The invention relates to a circuit for compensating errors in the form of noise and/or distortion from the output stage of a digital amplifier, the digital amplifier comprising: a pulse modulator being adapted to generate a set of control pulses in response to the digital amplifier input signal and a digital compensation signal, a first switching output stage connected to a power supply circuit, the first switching output stage being adapted to receive the set of control pulses and produce the digital amplifier converter output.

Further the invention relates to a method for compensating errors in the form of noise and/or distortion from the output stage of a digital amplifier in which a pulse generator generates a set of control pulses in response to an input signal transferred to the amplifier and generates a digital compensation signal, said output stage comprises a first switching output stage for producing the output from the amplifier.

BACKGROUND OF THE INVENTION

Conventional digital pulse-width modulated amplifiers usually have very precise power supplies in order to achieve a good sound quality, since any ripple or noise in the power supply voltage is undesired and is transferred to the output and thereby to the loudspeaker. Power supplies for this type of amplifiers therefore typically have a rectifier, a low-pass filter and a regulator. To achieve a desired sound quality, it is necessary to use a complicated and thereby expensive regulator and/or insert large and thereby expensive capacitors and inductors in the power supply filter.

As mentioned above, in connection with digital amplifiers of the above-mentioned type it is well-known that noise from the power supply of the digital amplifier modulates the audio signal. It is difficult to compensate this noise by negative feedback, as is known in connection with analogue amplifiers. This means that if the noise is not compensated in a manner other than by negative feedback, then intermodulation noise/distortion of 5–10% may occur, which is unacceptable.

A known manner, cf. e.g. U.S. Pat. No. 5,559,467, of compensating noise and errors in a digital amplifier comprises feeding the signal of the power supply in a feedforward coupling to an A/D converter which, via a divider circuit dividing an interpolated input signal by the output signal of the A/D converter, is fed to a noise shaper whose output is fed to a pulse width modulator which provides a correction signal that, from the input signal, removes ripple voltages from the power supply. This known way of eliminating ripple voltages, however, requires relatively expensive non-linear circuit components and/or signal computations. For example, is the division process a time consuming task on a digital signal processor.

For the above-mentioned method, it is essential to keep the delay through the correction circuits and digital amplifier to a minimum. Otherwise, the effect of the compensation is strongly reduced, since the compensation action happens too late after the occurrence of the error of the switching output stage.

An improved circuit disclosed by the inventor of U.S. Pat. No. 5,559,467 in the publication "IEEE, Power Electronocs Specialist Conf. REC., 1995, p 96–102, vol. 1", comprises further a predictor filter to compensate for the delays in the feedforward compensation loop (e.g. delays in the A/D converter and in the digital amplifier). The drawback is that the prediction filter is relatively expensive expressed in hardware or commutation cycles of a digital signal processor. Secondly, a prediction filter will normally amplify high frequency noise in the system possibly resulting an adverse effect on the system performance.

Accordingly, an object of the invention is to provide a circuit which is partly more accurate and is partly less expensive to implement than the mentioned known circuits.

This and other objects of the invention is achieved in accordance with one aspect of the invention in that the compensation circuit comprises:

a multiplying D/A converter (MDAC) with an analog input signal and a digital input signal, producing and analog output signal being substantially proportional to the analog and digital input signals, the analog input of the MDAC receiving an error signal characteristic of errors and or noise in the output stage, a feedback path from the analog output of the MDAC to the digital input of the MDAC, the feedback path having a digital section and an analog section, the digital compensation signal being derived from one or more signals in the digital section of the feedback path.

With a view to a particularly simple design of the regulation loop, it is noted that in one aspect of the invention the feedback path around the MDAC comprises an analog to digital converting circuit separating a digital section of the feedback path from an analog section of the feedback path.

According to another aspect of the invention, the feedback path comprises an analog to digital converting circuit (ADC) adapted to receive an analog signal from the analog section of the feedback path and producing a digital converter output signal feeding into the digital section of the feedback path.

Thus according to this aspect of the invention, the compensation circuit is formed by a regulation loop formed by a feedback path around a multiplying D/A converter with an analogue input which receives an error signal, such as a multiplicative error signal m(t) (to be explained below), characteristic of the output stage on its analogue input, said multiplying D/A converter multiplying the multiplicative error signal m(t) by a compensating signal c(k) which is provided in the regulation loop. The compensation signal c(k) is fed to a second input of the pulse modulator that produces an output signal in response to the amplifier input signal and the compensation signal in order to compensate for the errors in the output stage. This can e.g. be achieved by comprising a multiplication of the amplifier input signal by the compensation signal.

By means of a regulation loop it is now possible according to this aspect of the invention to implement the invention with relatively inexpensive circuit components, as these may consist of simple linear components, as is known in connection with ordinary regulation loops, and without any requirement of huge data calculations, as is required by e.g. a predictor or divider circuit.

According to a further aspect of the invention, the feedback path has a transfer characteristic with a high gain in particular at low frequencies, it is ensured that the errors are compensated in particular well at low frequencies (e.g. in the audio band).

Further, the low-pass filter transfer characteristic of the feedback path, according to this aspect of the invention, will compensate the delays that occur in the compensation circuit. Finally, the low-pass filter characteristic results in a noise shaper effect, which gives the additional advantage that it is sufficient to work with an ADC with lower resolution and precision (e.g. with a much lower number of bits than by linearly coded audio PCM, i.e. typically in the range of 1–10 bits). Thereby the ADC can be realized as a simple and inexpensive circuit that has a low response delay.

In accordance with a still further aspect of the invention, the analog section of the feedback path is adapted to receive a reference input voltage then this reference input voltage can designate the reference point for the compensation circuit, the reference operating state where no compensation is needed.

In accordance with yet another aspect of the invention, the analog to digital converting circuit comprises one or more local feedback path(s), such local feedback paths can help to improve the precision of the ADC circuit or, conversely, to relax the needed precision of the components in the ADC circuit. Further, the local feedback paths can improve the overall stability of the regulation loop.

In accordance with a still further aspect of the invention, the analog to digital conversion circuit produces a one-bit (i.e. 1-bit) digital converter output signal, it is achieved that the ADC circuit as well as other parts of the compensation circuit may be realized by quite simple and inexpensive circuit components with reduced accuracy and tolerance requirements.

As mentioned the invention also relates to a method.

In accordance with another aspect of the invention, the method is characterized in an analog an a digital signal is transferred to the input of a D/A converter for delivering at its output an analog signal proportional to the analog and digital input signals, said output signal being transferred in a feedback path to the digital input of the D/A converter, said feedback path having a digital and an analog section, said digital section being used for deriving compensation signals.

BRIEF DESCRIPTION OF THE DRAWINGS

The invention will now be explained more fully with reference to the drawings, in which FIG. 3 shows a block diagram of a first embodiment of the invention, while FIG. 8 shows an embodiment of a saw tooth carrier waveform generator 20 forming part of the ADC circuit embodiment of FIG. 7., while FIG. 9 shows an embodiment of an adaptation filter 21 which forms part of the circuit in FIG. 3, FIG. 11 shows a further circuit for the implementation of the invention, whereas.

DETAILED DESCRIPTION

Figure 1:
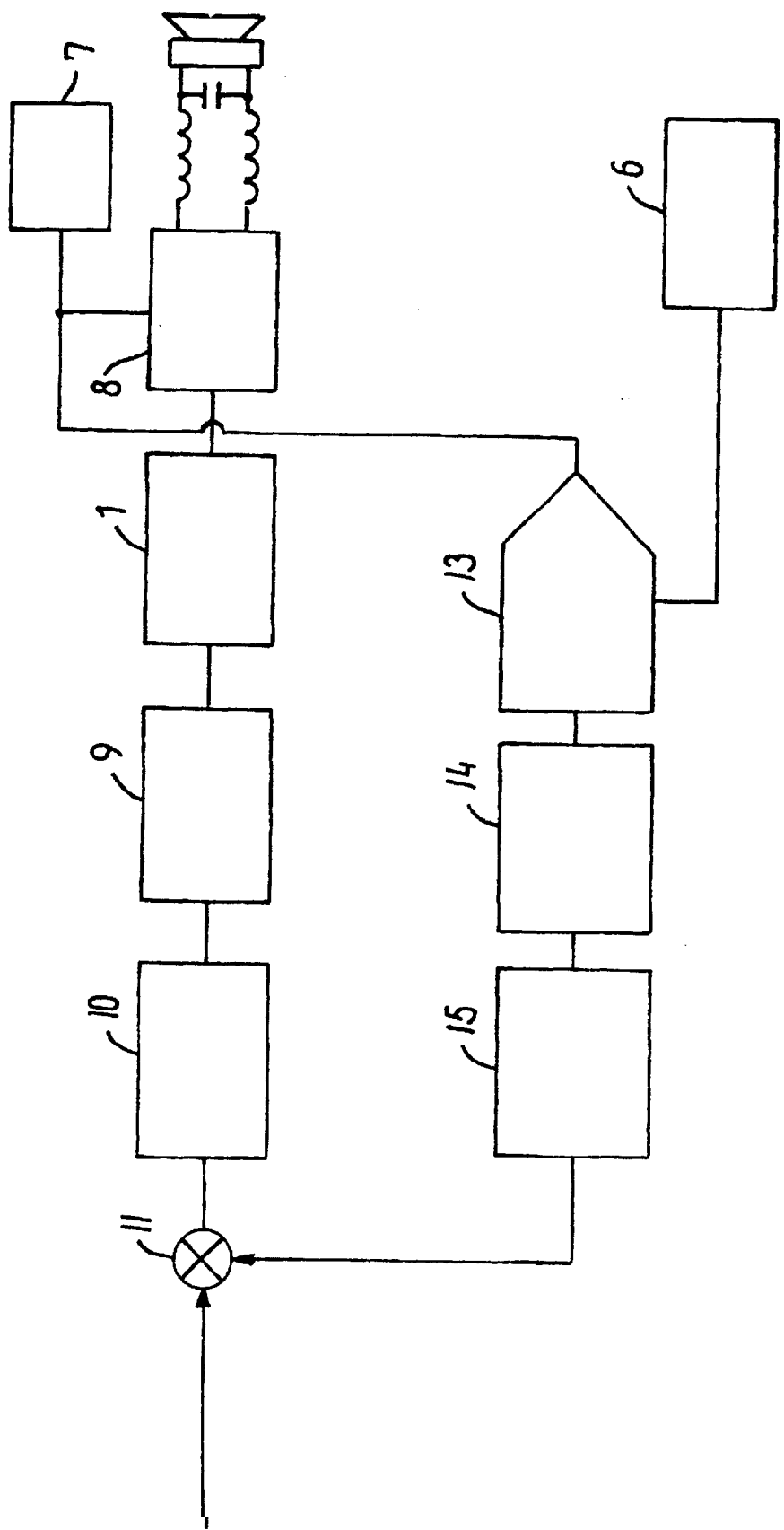
FIG. 1 shows an example of a block diagram of a known circuit configuration.

FIG. 1 shows a known digital amplifier where the numeral 1 designates a UPWM modulator which pulse-width modulates an audio signal that is demodulated (recreated) in a switching output stage (here shown as an H-bridge) and a subsequent low-pass filter. The output from the low-pass filter is connected to the loudspeaker shown in the figure. As is known, the H-bridge receives voltage from a power supply 7. A compensation circuit is inserted with a view to eliminating noise or ripple voltages from the power supply 7 and feeds forward a compensation signal c(k) in the set-up shown, cf. the following.

An error signal is measured by means of an A/D converter 13 to whose two inputs a reference signal and a signal from the power supply 7 are fed, respectively. The ratio between these signals constitutes the multiplicative error which is fed to a predictor 14, whose output signal x is fed to a divider circuit 15 in which the division 1/X is performed to form a compensation signal. This circuit contains non-linear circuit components, e.g. the divider circuit 15, and a relatively expensive prediction circuit.

Figure 2:
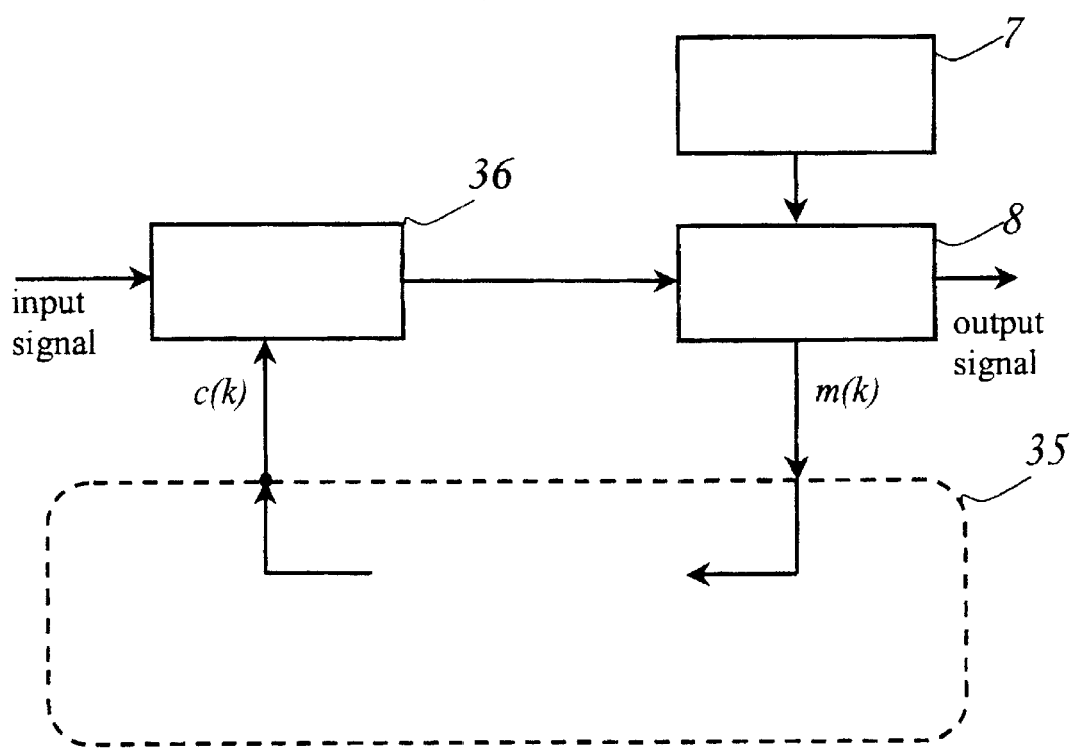
FIG. 2 shows the general structure of a compensation circuit according to the invention.

The invention is based on a more general compensation circuit topology cf. FIG. 2 receiving a generalized error signal m(t) that is generated in response to signals in the power supply circuit 7 and switching output stage 8. The compensation circuit 35 produces then a digital compensation signal c(k) in response to the error signal and the pulse modulator 36 is adapted to receive the compensation signal in response to both the input signal and the compensation signal.

An embodiment according to FIG. 2 is found in FIG. 3, that in the following is used to explain the principles of the invention.

Figure 3:
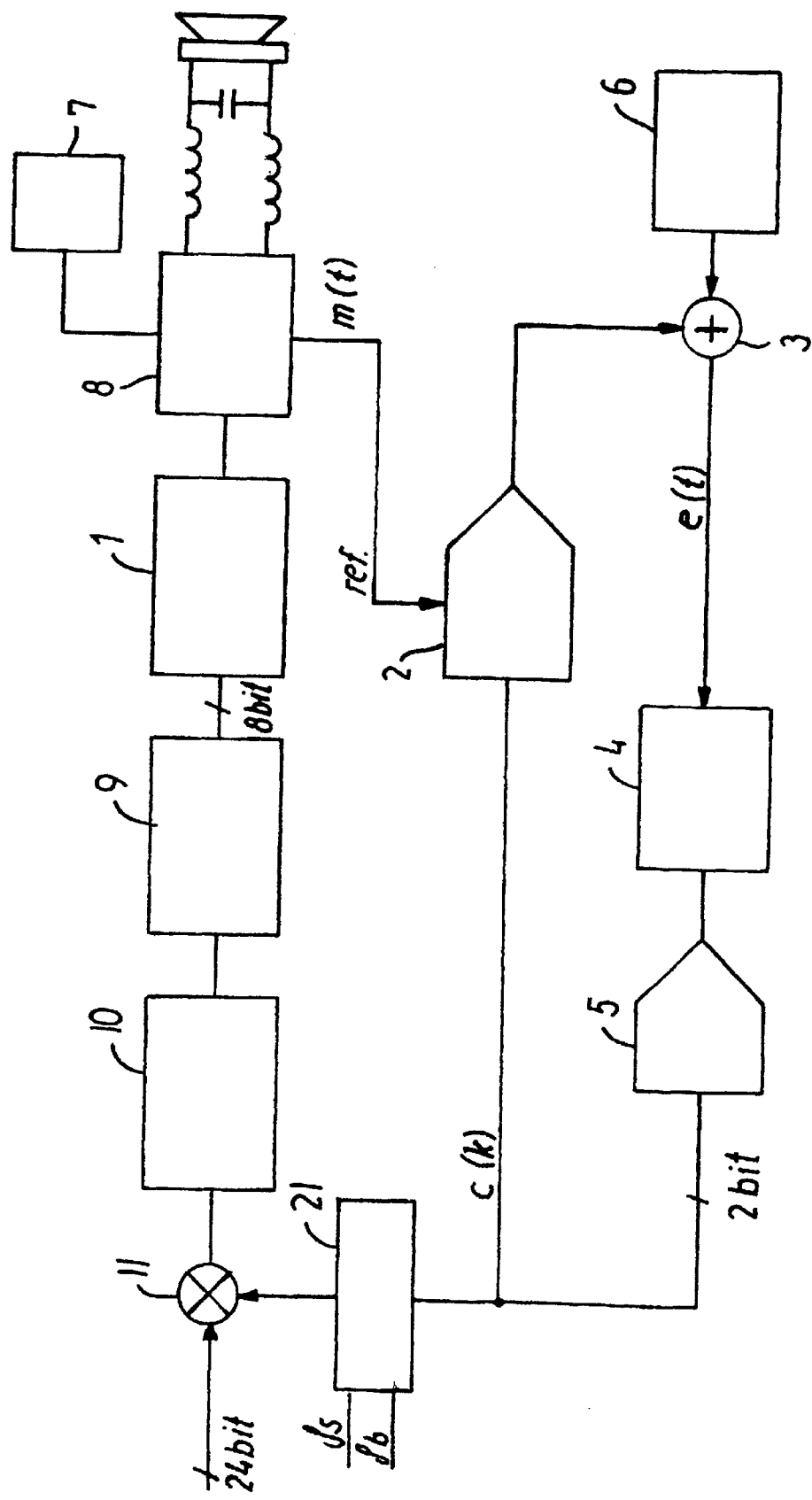

FIG. 3 shows a digital amplifier, which consists of a pulse modulator 36, in this embodiment comprising a PCM to PWM conversion circuit (in this example comprising a multiplier 11, feedforward correction circuit 10, noise shaper 9 and a Uniform Pulse Width Modulator—UPWM 1). The noise shaper 9 produces a noise-shaped output signal with reduced bit resolution (e.g. 5–10 bits). The UPWM modulator 1 produces a set of control signal that again controls a set of switches in an switching output stage (shown as a H-bridge 8) being connected to a power supply circuit 7, thereby allowing audio information in the form of electrical energy to be transferred to a load, shown here as a loudspeaker preceded by a low pass filter consisting of two inductors and a capacitor.

The switches in the H-bridge transfer power directly from a power supply 7 to the load. This means that if distortion is to be obviated, then the power supply must be very accurate, which will normally require relatively expensive components which incorporate large capacitors and inductances or costly active regulation circuits.

To reduce the requirements of the power supply and to reduce the errors of the switching output stage, a regulation loop is inserted according to the invention, said regulation loop receiving an error signal in the form of a multiplicative error signal m(t), and emitting a compensation signal c(k) to a pulse modulator, e.g. to a multiplication circuit 11 via a filter 21, cf. the discussion below.

The actual regulation loop consists of a multiplier, here shown as a multiplying D/A converter 2, which receives the multiplicative error signal m(t) on the analogue input (in some connections called a reference input-not to be confused with the reference voltage 6 in FIG. 3), and the digital compensation signal c(k), provided in the loop.

A first input of a summation unit 3 is coupled to the output of the multiplying D/A converter 2, and the second input of the summation unit is coupled to reference voltage source Vref 6.

A second error signal e(t) is formed on the output of the summation unit 3, said second error signal being indicative of an instantaneous error in the regulation loop. This second error signal e(t) is fed to a loop filter 4 which is a low-pass filter with a high gain in particular at low frequencies. The output from the loop filter 4 is fed to an A/D converter, shown as an ADC circuit 5 in FIG. 3.

The output from this ADC circuit is branched in two signal paths, one of which leading to the digital input on the multiplying D/A converter 2, the other signal path leading to an adaptation filter 21, that produces the compensation signal in response to the ADC converter output. The adaptation filter can implement a number of processing steps to provide the compensation signal in a desired form. Examples of such processing steps can be low pass filtering to reduce the high frequency noise contents, change of sample rate (e.g. decimation) to allow different sample rates within the pulse modulator and the compensation loop. Further improvements can be obtained by using non-linear processing to improve the precision of the compensation and to reduce the implementation cost of the system. Examples of such processing steps are given below.

In the embodiment of FIG. 3, the compensation signal c(k) (i.e. the output of the adaptation filter 21) is fed to the multiplier 11 of the pulse modulator circuit in which a digital audio signal is multiplied by the compensation signal formed in the regulation loop. The audio signal is hereby compensated for the multiplicative errors which are expressed by the multiplicative error signal m(t), which thus indicates the error by reproduction of the pulse coding (e.g. PWM coding) of the audio signal in a multiplicative form (in contrast to the more usually employed additive form). Mathematically, the following equation can describe a multiplicative error model:

$$X_{OUT}(t) = X_{IN}(t) * m(t) \qquad \text{Equation 1}$$

where $X_{OUT}(t)$ describes the output signal to the load, and $X_{IN}(t)$ describes the PWM control signal of the H-bridge, while m(t) describes the multiplicative error signal.

In other words, the multiplicative error signal describes the temporal variation of the "gain" of the switching output stage (H-bridge 8) and is thereby indicative of the noise and the distortion which the output stage applies to the encoded audio signal.

The multiplicative error signal m(t) may be formed by an approximation, e.g. by using the power supply voltage of the H-bridge as an approximation for m(t). The justification for this approximation is that the output voltage of the H-bridge is substantially proportional to the power supply voltage of the H-bridge, i.e. the power supply voltage expresses the gain as function of time for the H-bridge. With this approximation, the effects of finite on-resistance and dynamical switching effects (low to high and high to low transitions etc.) are disregarded.

As a further improvement, the error signal m(t) can be derived from one or more signals in the power supply circuit in a way so that the error signal is substantially proportional to the power supply voltage and advanced in time by a time offset relative to the power supply voltage. The time offset can beneficially be adapted to compensate for the delays in the compensation loop and digital amplifier. Thereby, the effect of the compensation is maximized. The timing lead of the error signal can e.g. be realized by having power supply filter prior to the switching output stage and tapping of a signal before the filter used to derive the error signal m(t). The power supply filter can e.g. be a traditional low pass filter consisting of a capacitor and an inductor. Other improvements can be to use adaptive signal processing to forecast the error of the H-bridge by using other input signals from the power supply circuit, e.g. the mains voltage.

As an even more precise method, m(t) may advantageously be formed as a ratio of the pulse modulated great signal (i.e. output signals of the switching output stage) to the pulse modulated small-signal or input control signal(s) for the output stage, cf. the description of the applicants' International Application No. WO 99/45641 which was not publicly available at the priority date of the present application, and which describes the formation of a multiplicative error signal.

The method will be described in brief below:

The multiplicative error signal may be derived from equation 1 as the ratio of the output signal $X_{OUT}$ to the (ideal) input signal $X_{IN}$ to the output stage:

$$m(t) = X_{IN}(t) * X_{OUT}(t) \qquad \text{Equation 2}$$

it being turned to account that if the pulse modulated (e.g. PWM) input signal $X_{IN}(t)$ can be described as a signal with two discrete values 1 and −1, then multiplication as well as division by such a signal is an identical operation.

A further advantage of the above-mentioned way of deriving m(t) is that the multiplication in equation 2 can be performed very simply by means of switches controlled by the pulse modulated control signals, precisely because of the use of just two discrete levels 1 and −1.

If m(t) derived corresponding to equation 2 is used for compensation purposes, it is ensured that both noise and ripple on the power supply, but also errors and non-idealities in the H-bridge are compensated, e.g. finite on-resistance and dynamical switching effects.

The compensating effect of the embodiment in FIG. 2 can be explained in the following manner:

The regulation loop forms a compensation signal c(k) which serves to "turn up" the audio signal when m(t) is diminished (e.g. because the voltage of the power supply drops or because of voltage drop due to the on-resistance of the H-bridge switches) and correspondingly to "turn down" when m(t) increases. Hereby, errors because of a varying supply voltage (noise/ripple) and non-ideality in the H-bridge may be compensated.

In the regulation loop the product of c(k) and m(t) is formed on the output of the multiplying DAC 2 which represents the reproduction of the signal c(k) in the amplifier without compensation for errors. Correspondingly, the H-bridge performs substantially a multiplication between the power supply voltage and the audio signal which has the shape of a PWM signal, i.e. the H-bridge output is substantially the product of the power supply voltage and the encoded audio signal of the digital amplifier.

The regulation loop seeks to minimize the second error signal e(t). The error signal e(t) is the difference between c(k)*m(t) and a reference signal 6. The reference signal 6 is typically a precise and constant DC source which expresses the desired effective gain of the H-bridge, i.e., the reference point for the compensation where no compensation is needed. However, nothing prevents the provision of a volume adjustment in the system in the regulation of the reference voltage 6, i.e. the overall system gain (or volume) will be substantially proportional to the reference voltage 6.

If e.g. the power supply voltage drops, this will be expressed in a reduced m(t) signal, and c(k) must correspondingly increase for the second error signal e(t) to be close to zero—in other words c(k) is inversely proportional to m(t). When c(k) is multiplied on the audio signal of the digital amplifier, a compensation for variations in the power supply will be achieved (expressed by the multiplicative error signal m(t) because of the inverse proportionality between c(k) and m(t)).

Mathematically, the ADC circuit 5 performs a sampling and quantization of the output of the loop filter 4 to whose output the error signal e(t) is applied.

Expressed in the z domain:

$$C(z)=H(z)E(z)+Q(z) \qquad \text{Equation 3}$$

where Q(z) is the quantization error in the z domain.

Correspondingly, as m(t) and Vref are here considered constants:

$$E(z)=\text{Vref}-m*C(z). \qquad \text{Equation 4}$$

From equations 3 and 4:

$$C(z)=(\text{Vref}+Q(z))/(1+m*H(z)). \qquad \text{Equation 5}$$

Since the loop filter H(z) is designed with a very high gain at low frequencies (i.e. in the audio range) and less gain at high frequencies, it will be seen that:

$$C(z)°\text{Vref}/m+q(z)/(1+m*H(z)). \qquad \text{Equation 6}$$

Thus, c(k) is substantially inversely proportional to m(t), and thereby compensation for the multiplicative error is achieved by multiplication by c(k). Additionally, c(k) includes a quantization error which is noise shaped, i.e. spectrally shaped by the loop filter H(z) 4. When the loop filter is of the low-pass type with a very high great gain at low frequencies, it is ensured that the error is suppressed in the low frequency range (i.e. audible range).

Because of the noise shaping, low-pass filtering 21 of the correction signal c(k) may advantageously be used before it is employed in the multiplier 11. Furthermore, non-linear or adaptive filtering may advantageously be introduced in some embodiments, cf. the subsequent description. The filter block 21 may also be adapted to change the sample rate of the incoming signal to the desired sample rate of the pulse modulator.

Figure 4:
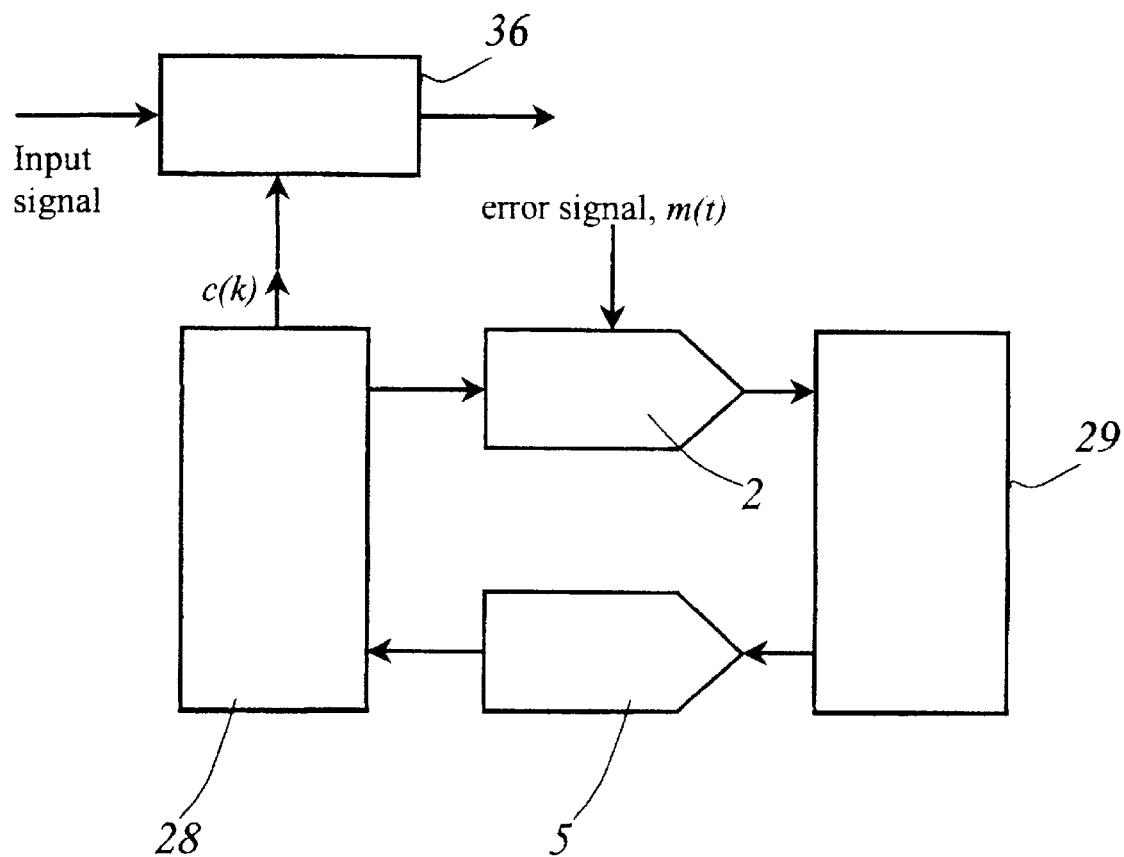
FIG. 4 shows a second and more general embodiment of the invention.

In a more general embodiment shown in FIG. 4, the compensation loop consists of an MDAC and an ADC embedded in a feedback path consisting of an analog section and a digital section. The compensation signal is in general derived from one or more signals inside the digital section of the feedback path.

The transfer characteristic of the entire feedback path constitutes the equivalent loop filter that, consequently, can be implemented in part as analog processing and in part by digital processing. In the analysis shown so far, the discrete-time equivalent loop filter (i.e. equivalent digital filter) H(z) for the combined transfer function of the feedback path has been used.

It can generally be beneficial to implement parts of the loop filter as a digital filter to simplify the analog sections that in general are prone to temperature variations and a not easy to integrate into integrated circuits. The feedback path may also include switched capacitor circuits that operate in discrete-time but using continuous amplitude signal representation.

The reference signal can in general be injected everywhere in the feedback path, i.e., digitally or in analog circuits or as a combination of both.

The feedback loop must be stable to operate according to the purpose. Therefore, it must be ensured that the poles of (1*m*H(z)) are within the unit circle. For the stability assessment, the equivalent loop filter H(z) must include the entire transfer function through the loop, including delays in all circuit elements in the loop, e.g. the ADC circuit etc. The loop filter must thus be designed such that stability can be achieved with a given filter order.

Furthermore, the equivalent loop filter should preferably be designed such that optimal error suppression is obtained in a desired frequency band (e.g., the audible range). Generally, a better error suppression can be obtained using a higher filter order of the equivalent loop filter.

Another way to increase the error suppression is to use a higher sampling frequency for the regulation loop. This sampling frequency can advantageously be higher (e.g. an integer multiple) than the sampling frequency used by the pulse modulator.

The compensation circuit may advantageously comprise the use of one-bit (1-bit) digital signals sampled at a typically high sample rate. The use of 1-bit signals is known form a certain type of data converters (e.g. sigma-delta or delta-sigma converters known from prior art) using noise-shaping to distribute the quantization noise outside the desired frequency band.

One advantage of 1-bit signal processing is that the analog data converting elements of the ADC and the MDAC is greatly simplified with relaxed requirements for precision and matching. Such circuit elements are in addition very suited for implementation in Very Large Scale Integration (VLSI) circuits using low cost digital process technology. Furthermore, the use of 1-bit data converter elements can take advantages of the inherent very high speed of circuits implemented in VLSI, i.e. to use clock and sampling frequencies in excess of 100 MHz.

Figure 5:
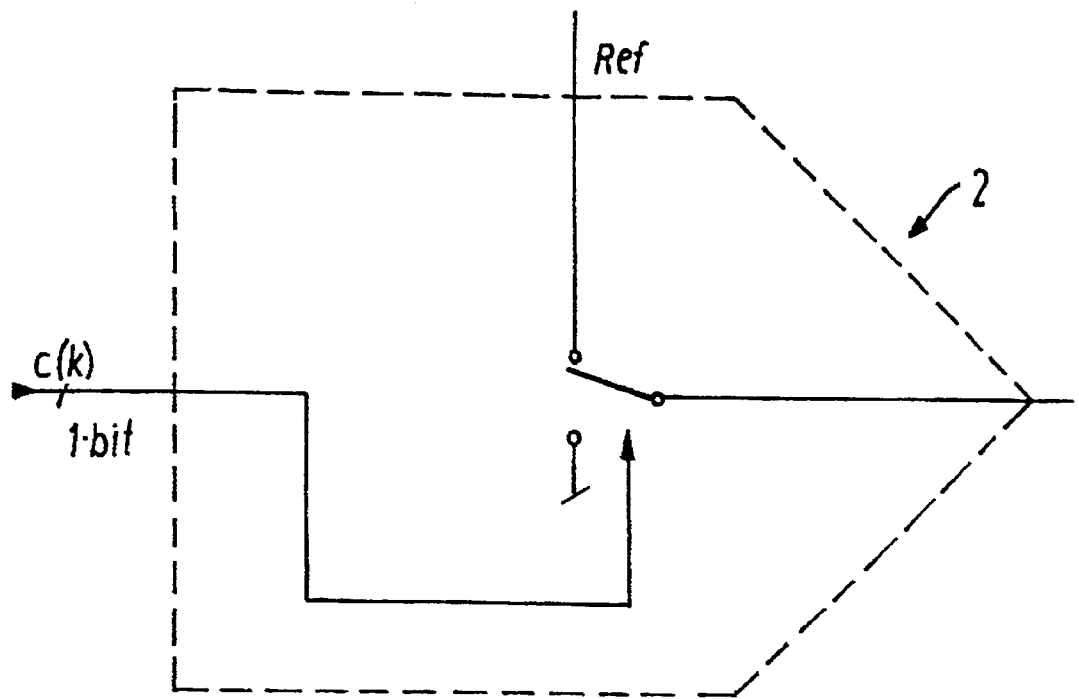
FIG. 5 shows a first embodiment a multiplying D/A converter (MDAC) 21 according to the invention.

In the following, different embodiments of sub-circuits using 1-bit signals according to the invention are shown:

In an embodiment of the D/A converter 2 in FIG. 3 and shown in FIG. 5, this just consists of a half-bridge controlled by the 1-bit signal c(k). Like the embodiment shown in FIG. 4 which is explained below, a multiplication between the analogue input m(t) and the digital input is achieved. The half-bridge does not need to handle high power and can be implemented cost-effectively in an integrated circuit using e.g. CMOS (Complementary Metal-On-Oxide) switches (i.e. transistors) arranged as an inverter consisting of a P-channel and N-channel switch. Generally, the MDAC can be formed as a switching output stage analogously to the switching output stage of a digital amplifier, however, as stated, the MDAC does not need to handle high power.

The embodiment in FIG. 5 is thus used for a 1-bit signal.

Figure 6:
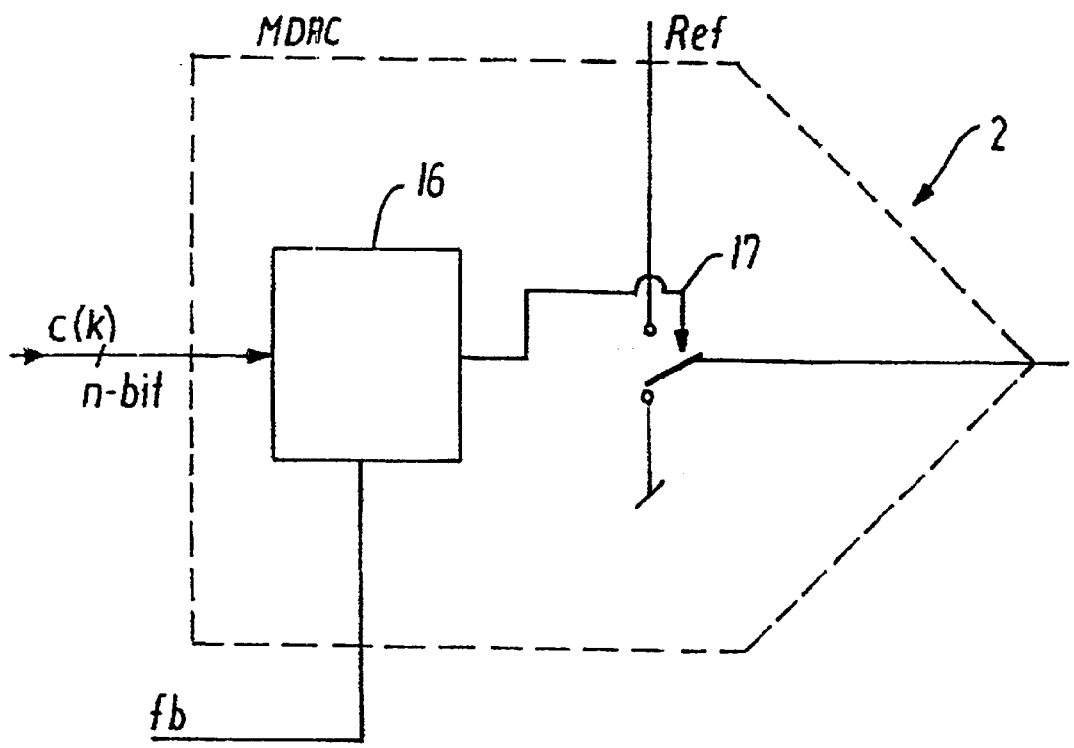
FIG. 6 shows a second embodiment a multiplying D/A converter (MDAC) 21 according to the invention.

FIG. 6 shows a second embodiment of the multiplying D/A converter 2 in FIG. 3. This embodiment may be used when the digital input of the MDAC is an n-bit signal, e.g., originating directly from an n-bit ADC circuit 5. A second pulse modulator (e.g. uniform pulse width modulator (UPWM) 16) converts the n-bit digital MDAC input signal into a 1-bit PWM signal, which controls a half-bridge 17 consisting of two contacts in the form of a switch. The half-bridge alternatively couples the analogue input signal m(t) or zero to the output of the multiplying D/A converter. This results in a desired multiplication between m(t) and the digital input signal of the MDAC. The circuit in FIG. 6 may be composed of digital building blocks in a very simple manner. In general, other embodiments can be designed using a pulse modulator embedded in the digital section of the feedback loop.

Figure 7:
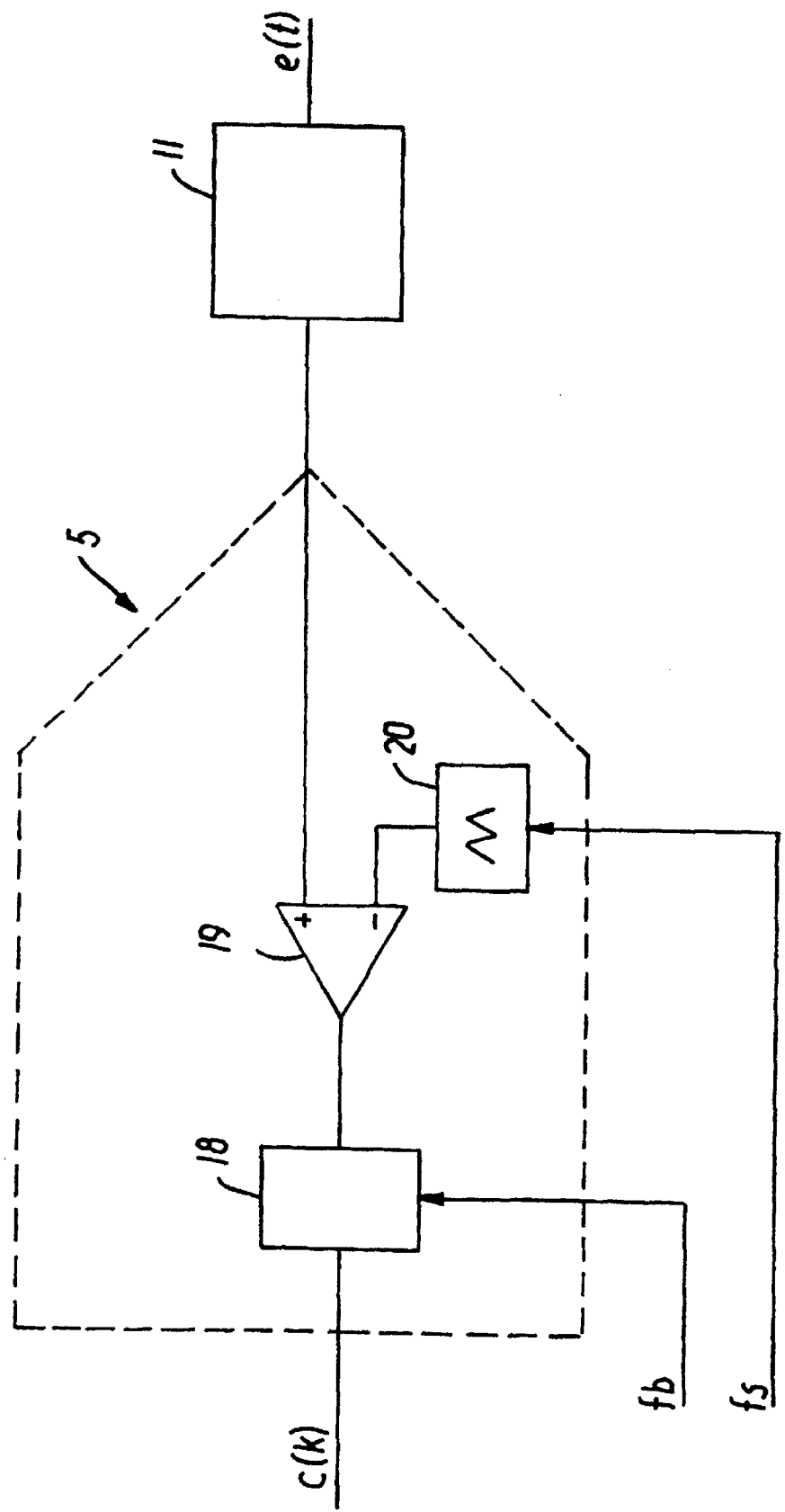
FIG. 7 shows an embodiment of an ADC circuit 5.

FIG. 7 shows an embodiment of the ADC circuit 5. This circuit consists of an analogue PWM modulator to form a 1-bit signal. A comparator 19 compares the input signal with a carrier waveform (e.g. triangle or saw tooth signal) from the generator 20 which can be synchronized with one of the sampling frequencies of the entire amplifier system. The output of the comparator is fed to a D flip-flop 18 which samples the comparator signal with a bit-clock signal of the frequency fb. The output of the D flip-flop is thereby a 1-bit signal. The quantization accuracy is decided by the ratio between the clock frequencies fb and fs, i.e., it is desirable to operate the system with a high bit clock frequency fb.

Figures 8, 9:
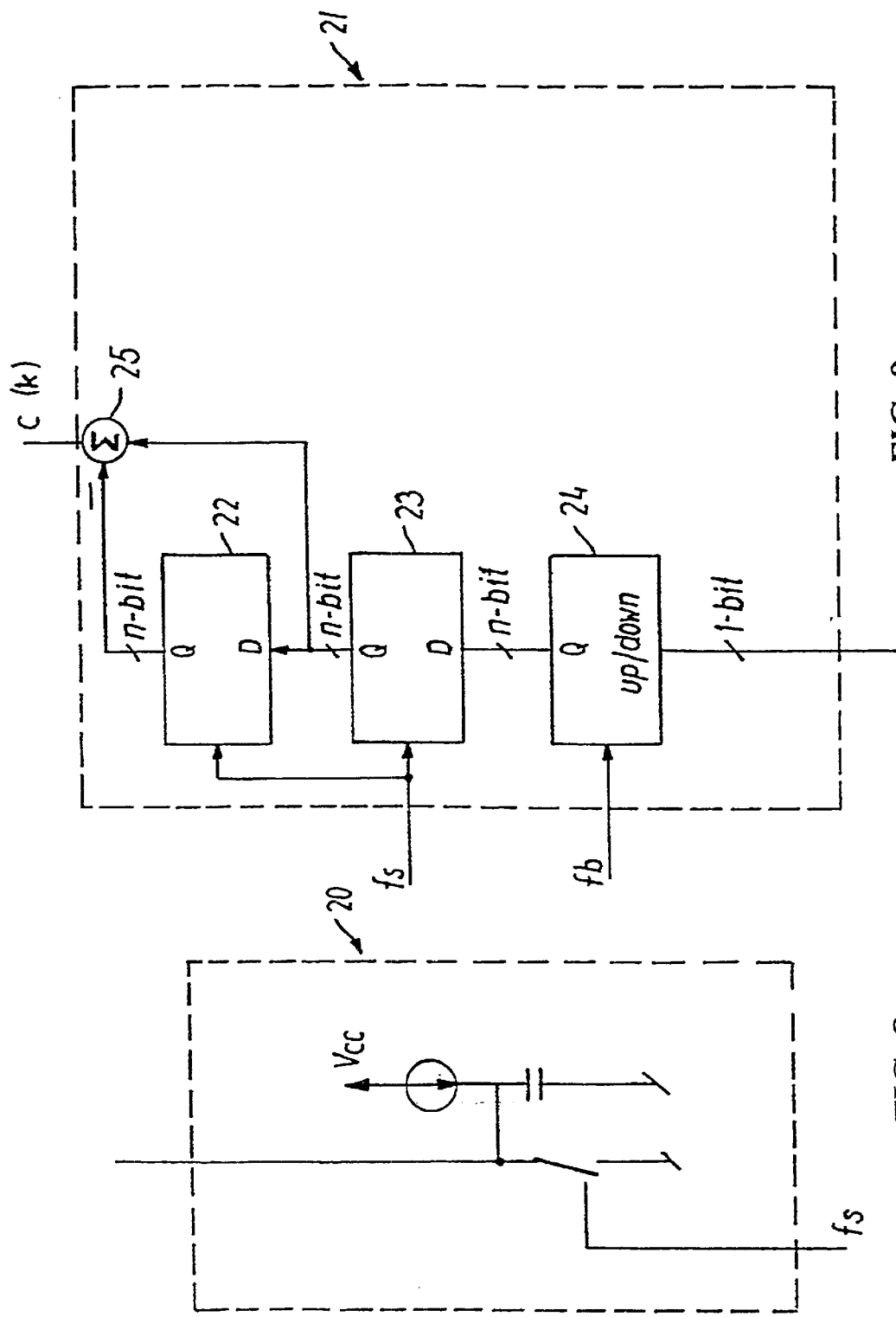

FIG. 8 shows an embodiment of a carrier generator 20 which forms part of the circuit 5. This generator consists of a capacitor which can be charged by a constant power source. Simultaneously, the capacitor may be discharged quickly (be short-circuited) by means of a contact which is controlled synchronously with the sampling frequency fs, a brief pulse for the contact being formed for each period. The voltage of the capacitor now forms a saw tooth signal. As an alternative embodiment, a triangular wave can be generated, e.g. by an integrator circuit fed by a square wave (preferably with 50% duty cycle) of the frequency fs. Other waveforms may be appropriate to change the characteristics of the compensation circuit.

The combination of FIGS. 5 and 7 thus gives a very simple embodiment which does not require precise analogue elements, but may be implemented in integrated circuits by means of simple and inexpensive digital process technology.

An alternate embodiment for the ADC circuit can be a sigma-delta modulator that produces a pulse density modulated compensation signal c(k). An example of an ADC circuit using sigma-delta modulation can be achieved using the circuit of FIG. 7 where the carrier waveform generator 20 produces a fixed zero signal. In this case, the feedback path through the MDAC will provide a loop filter for the sigma-delta modulator.

In general, the ADC circuit may have additional local feedback paths to improve the performance. As an example, a sigma-delta modulator is a circuit that can convert an analog waveform into a digital signal of the 1-bit type. A sigma-delta modulator comprises typically a 1-bit sampling unit (e.g. comparator with a D-flip flop), a D/A converting unit (e.g. analogous to FIG. 5) and a loop filter structure that applies feedback around the 1-bit sampling unit to suppress quantization noise in a desired frequency band.

Figure 12:
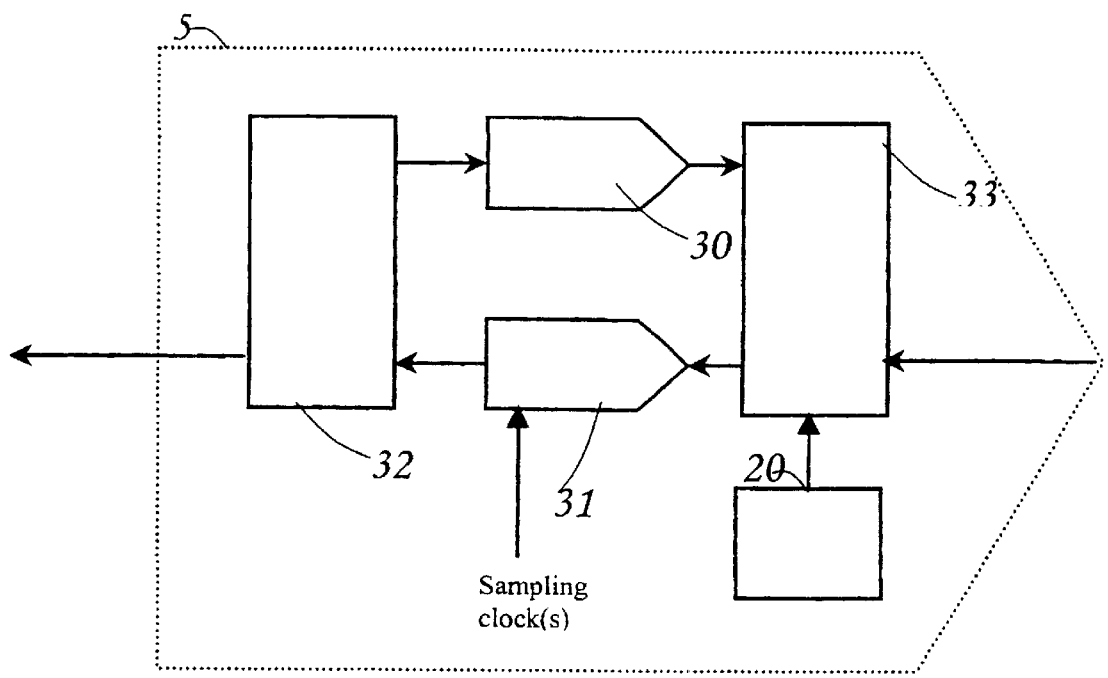
FIG. 12 shows a general alternative embodiment of the ADC circuit according to the invention.

The more general embodiment of the ADC circuit shown in FIG. 12 shows an example of how a local feedback path can be implemented, in which 31 is a sampling and A/D converting element (e.g. low resolution converter such as a comparator and D-flip flop etc.) receiving a sampling clock signal, 30 is a D/A converter (e.g. a 1-bit D/A converter), 33 is an analog network implementing the local feedback path and possibly receiving a carrier waveform, 32 is digital circuit forming the ADC circuit output signal and providing digital input to the D/A converter 30. This general embodiment can implement a variety of noise-shaped and over-sampling ADC converters, including pulse width modulated converters and sigma-delta modulators like the embodiment of FIG. 7.

The advantage of having a local feedback path in the ADC circuit is that less gain is needed in the overall feedback path through the MDAC in order to suppress errors of the ADC circuit. Furthermore, the local feedback path can also de adapted to improve the overall stability of the system, since the local feedback path changes the overall equivalent loop transfer characteristic.

As described above, the output of the ADC circuit may advantageously be a 1-bit (or few bit) digital signal sampled at a quite high sample rate, e.g. a bit clock frequency fb that can exceed 100 Mhz in frequency using VLSI implementations. Such high sample rate is typically not accepted by the pulse modulator and a sample rate change is needed.

The sample-rate change can be implemented as a decimation process, i.e. a band-limiting filtering followed by a down sampling (i.e. re-sampling to a lower frequency). The art of decimation is well known in the literature and shall not be described further here. However, there are curtain implementation aspects for a decimator running at excess of 100 MHz on the input, i.e. such circuitry is highly costly. Furthermore, the band-limiting filter must be very effective such that aliasing errors are avoided by the down sampling.

In the following, a number of embodiments for the adaptation processing of the ADC output signal to from the compensation signal c(k) is discussed.

FIG. 9 shows an embodiment of the adaptation filter 21 which receives the 1-bit signal sampled at the bit clock frequency fb and performs down-sampling to the n-bit signal c(k) sampled at the switch frequency fs. The embodiment consists of an up/down (or up/hold) counter 24 which is clocked by fb, and which is controlled up or down (up or hold) depending on the incoming 1-bit signal. Synchronously with fs, the output of the counter 24 is sampled by a first latch 23 and whose output is sampled by a second latch 22. Subtraction 25 between the outputs of the two latches 22, 23 gives the compensation output signal c(k). The shown circuit of FIG. 9 computes the pulse width expressed as the integral of the incoming 1-bit signal over each sampling period for the compensation signal. This filter is normally referred to as a "sinc" filter. FIG. 9 thus implements a decimator using a sinc filter running at the high input sample rate fb and down sampling to fs.

Another way to describe the effect of the adaptation filer of FIG. 9 is that the circuit extracts the pulse width of the incoming signal for each sample period of fs.

The sinc filter is not a very good band-limiting filter, so aliasing errors occur. However, the circuit of FIG. 9 is simple to implement and can be operate with very high speed fb in a VLSI circuit.

It can be seen, that the circuit of FIG. 9 acts as a PWM to PCM translator. Since the conversion between PCM and PWM is known to be highly on-linear, errors are to be expected using the circuit of FIG. 9.

A sampled data model for the non-linearity of the PCM to PWM conversion is to be found in the applicant's European patent application which has the publication number EP 0890221 A1. This model can describe errors in great detail and can be used to implement an improved adaptation processing that operates at the lower output sample rate fs, but using non-linear processing to compensate for the errors.

Figure 10:
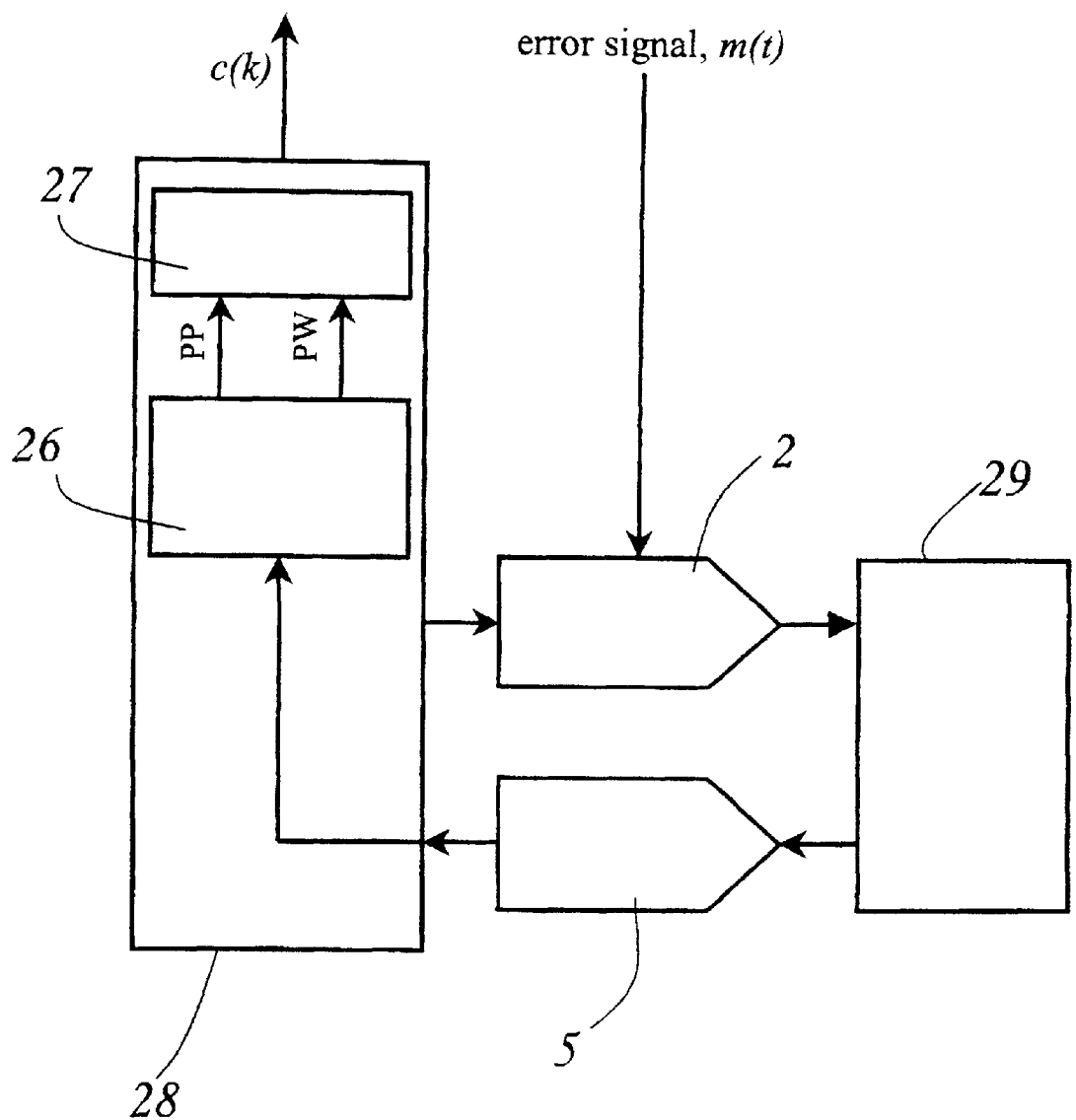
FIG. 10 shows an embodiment of the invention with improved adaptation processing.

FIG. 10 shows a general structure that can implement such processing, in which the digital section of the feedback path 28 comprises a pulse detector 26 and a further processing circuit 27. The pulse detector extracts two signals, the pulse width and the pulse position for each pulse period or sample interval of fs. The circuit of FIG. 9 actually implements the pulse detector that extracts the pulse width, but not the pulse position. The pulse position can be extracted using a counter and detector circuit that detects the rising and falling transition of the incoming 1-bit signal. The middle point between these two timing instants (e.g. read-out from the counter at the transition instants) relative to the center of the sample interval constitutes the pulse position PP. The difference of the transition point time instants expresses the pulse width. Consequently, a counter/detector circuit can implement the pulse detector 26 in FIG. 10.

The pulse position signal carriers further information together with the pulse width signal, needed to construct a high precision compensation signal output. Note that the pulse position information is disregarded in the circuit of FIG. 9, i.e., a lower precision is accomplished than by using the pulse position information.

Figure 11:
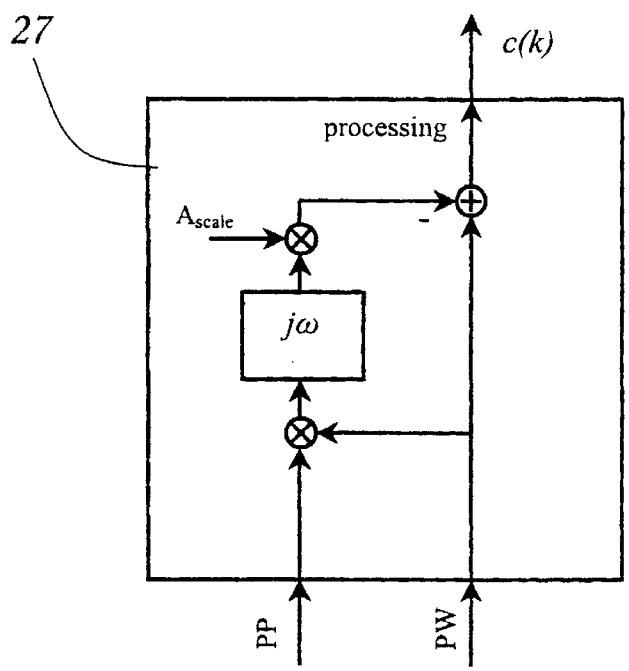

Using the mentioned sampled data models of the non-linearity of the conversion between PCM and PWM, a processing circuit of FIG. 11. The circuit of FIG. 11 uses a multiplier to form the product of the pulse width PW and the pulse position PP, the product being fed to a filter with a transfer function substantially equal to jω followed by a scaling by a constant and summation with the pulse width signal PW. The resulting signal will then have a much higher precision than by just using the pulse width. The advantage of the non-linear processing is that it is performed at a low sample rate as opposed to the possibly very high fb clock rate. Furthermore, the circuit of FIG. 11 can be implemented simply in VLSI with very low circuit complexity and processing delays. Furthermore, the pulse detector can still operate with a very high fb clock frequency to maximize the resolution of the compensation signal.

What is claimed is:

1. A digital amplifier comprising a circuit for compensating errors in the form of noise and/or distortion from the output stage of a digital amplifier, the digital amplifier comprising:

a pulse modulator (36) for generating a set of control pulses in response to the digital amplifier input signal and in response to a digital compensation signal (c(k)), a first switching output stage (8) connected to a power supply circuit (7), the first switching output stage for receiving the set of control pulses and producing a digital amplifier converter output, a multiplying D/A converter (MDAC) (2) with an analog input signal (m(t)) and a digital input signal (c(k)), producing an analog output signal, the analog input (m(t)) of the MDAC receiving an error signal characteristic of errors and/or noise in the output stage; and a feedback path (3,4,5,28,29) from the analog output of the MDAC (2) to the digital input of the MDAC (2), the feedback path having a digital section and an analog section (3,4,29), the digital compensation signal (c(k)) being derived from one or more signals in the digital section (5,28) of the feedback path (3,4,5,28,29).

2. Amplifier according to claim 1, wherein the feedback path (3,4,5,28,29) comprises an analog to digital converting circuit (ADC) (5) receiving an analog signal from the analog section (3,4,29) of the feedback path (3,4,5) and producing a digital converter output signal feeding into the digital section (5,28) of the feedback path (3,4,5,28,29).

3. Amplifier according to claim 2, wherein the feedback path (3,4,5,28,29) has a transfer characteristic with a high gain in particular at low frequencies.

4. Amplifier according to claim 3, wherein the analog section (3,4,29) of the feedback path (3,4,5,28,29) receives a reference input voltage (6).

5. Amplifier according to claim 4, wherein the ADC (5) comprises at least one local feedback path (30,31,32).

6. Amplifier according to claim 2 wherein the ADC (5) produces a one-bit (i.e. 1-bit) digital converter output signal (FIG. 7).

7. Amplifier according to claim 1 wherein the ADC (5) comprises a pulse width modulator (FIG. 7) or sigma-delta modulator.

8. Amplifier according to claim 1 wherein the digital section (5,28) comprises a pulse modulator (16).

9. Amplifier according to claim 1 wherein the MDAC (2) is formed by a second switching output stage (FIGS. 5, 6) receiving the error signal and being controlled by one or more digital signals (c(k)) from the digital section (5,28) of the feedback path (3,4,5,28,29).

10. Amplifier according to claim 9, wherein the second switching output stage (FIGS. 5,6) is formed by a half-bridge (17).

11. Amplifier according to claim 2 wherein the digital compensation signal (c(k)) is derived from the ADC output signal (c(k)) using at least one adaptation processing involving (21, FIG. 9) linear filtering and non-linear filtering and change of sample rate.

12. Amplifier according to claim 11, wherein the adaptation processing comprises a pulse detector (26) for detecting the pulse width (pw) and the pulse position (pp) for each pulse period of the ADC output signal, the pulse width (pw) and position (pp) being processed to generate the digital compensation signal (c(k)).

13. Amplifier according to claim 1 wherein the digital compensation signal (c(k)) is derived using a decimation process (FIG. 9).

14. Amplifier according to claim 13, wherein the decimation process comprises a sinc low-pass filter (FIG. 9) implemented as a counter circuit (24) connected to a downsampling circuit (22,23,25).

15. Amplifier according to claim 1 wherein the compensating circuit is formed in full or in part by an integrated circuit.

16. Amplifier according to claim 1 wherein the error signal (m(t)) is derived using a product of the pulse modulator control signal and the output signal of the first switching output stage (8).

17. Amplifier according to claim 1 wherein the error signal (m(t)) is derived from the power supply circuit (7) for the first switching output stage H-bridge (8).

18. Amplifier according to claim 1 wherein the error signal (m(t)) is for leading the power supply voltage (7) for the first switching output stage (8) by a time offset.

19. Method for compensating errors in the form of noise and/or distortion from the output stage (8) of a digital amplifier in which a pulse modulator (36) generates a set of control pulses in response to an input signal transferred to the amplifier and in response to a digital compensation signal (c(k)), said output stage (8) comprises a first switching output stage (8) for producing the output from the amplifier, an analog signal from the output stage of the amplifier m(t)) and a digital signal (c(k)) is transferred to the input of an MDAC (2) for delivering at its output an analog output signal, said analog output signal being transferred in a feedback path (3,4,5,28,29) to the digital input of the MDAC, said feedback path (3,4,5,28,29) having a digital (5,28) and an analog (3,4,29) section, said digital section being used for deriving the digital compensation signal (c(k)).

20. In a digital amplifier, a circuit for compensating errors in the form of noise and/or distortion from the output stage of a digital amplifier comprising: a multiplying D/A converter (MDAC) with an analog input signal and a digital input signal, producing an analog output signal, the analog input of the MDAC receiving an error signal characteristic of errors and/or noise in the output stage;

a feedback path from the analog output of the MDAC to the digital input of the MDAC, the feedback path having a digital section and an analog section, the digital compensation signal being derived from one or more signals in the digital section of the feedback path.

* * * * *